United States Patent
Naito et al.

(10) Patent No.: US 7,375,292 B2
(45) Date of Patent: May 20, 2008

(54) ELECTROMAGNETIC WAVE SHIELDING FILTER AND PROCESS FOR PRODUCING THE SAME

(75) Inventors: Nobuo Naito, Tokyo-To (JP); Fumihiro Arakawa, Tokyo-To (JP); Tadahiro Masaki, Tokyo-To (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 106 days.

(21) Appl. No.: 10/583,267

(22) PCT Filed: Dec. 14, 2004

(86) PCT No.: PCT/JP2004/018631

§ 371 (c)(1), (2), (4) Date: Jun. 15, 2006

(87) PCT Pub. No.: WO2005/060326

PCT Pub. Date: Jun. 30, 2005

(65) Prior Publication Data

US 2007/0102192 A1    May 10, 2007

(30) Foreign Application Priority Data

Dec. 16, 2003   (JP) .............................. 2003-417467

(51) Int. Cl.
*H05K 9/00* (2006.01)
(52) U.S. Cl. ...................... 174/389; 174/392; 313/479
(58) Field of Classification Search ................ 174/389, 174/392; 361/816, 818; 313/479
See application file for complete search history.

(56) References Cited

U.S. PATENT DOCUMENTS 5,012,041 A * 4/1991 Sims et al. .................. 174/381

| | | | |
|---|---|---|---|
| 2003/0007341 A1 | 1/2003 | Shimamura et al. | |
| 2003/0013048 A1* | 1/2003 | Gilson | 430/321 |
| 2003/0164243 A1 | 9/2003 | Arakawa et al. | |
| 2004/0170857 A1* | 9/2004 | Yoshihara et al. | 428/553 |
| 2004/0222003 A1 | 11/2004 | Kim et al. | |
| 2005/0178569 A1* | 8/2005 | Kotsubo | 174/389 |

FOREIGN PATENT DOCUMENTS

| | | |
|---|---|---|
| JP | A-2000-013088 | 1/2000 |
| JP | A-2000-059079 | 2/2000 |
| JP | A-2000-077887 | 3/2000 |
| JP | A-2002-009484 | 1/2002 |
| JP | A-2002-347166 | 12/2002 |
| JP | A-2002-353684 | 12/2002 |
| JP | A-2003-037388 | 2/2003 |

(Continued)

*Primary Examiner*—Hung V. Ngo
(74) *Attorney, Agent, or Firm*—Oliff & Berridge, PLC

(57) ABSTRACT

An electromagnetic wave shielding filter comprises a transparent substrate 11, and a metal mesh layer 21 with line parts 107 that define openings 105 of the mesh, laminated to one surface of the transparent substrate 11 by an adhesive 13. A first blackening layer 25A and an anticorrosive layer 23A are successively formed on the surfaces, on the transparent substrate side, of the line parts 107 of the metal mesh layer 21. A second blackening layer 25B is formed on surfaces, on the side opposite to the transparent substrate 11, of the line parts 107 of the metal mesh layer 21, and also on side faces of the line parts 107.

11 Claims, 2 Drawing Sheets

FOREIGN PATENT DOCUMENTS

| | | |
|---|---|---|
| JP | A-2003-258488 | 9/2003 |
| JP | A-2003-304090 | 10/2003 |
| JP | A-2003-318596 | 11/2003 |
| JP | A-2004-014538 | 1/2004 |
| JP | A-2004-320025 | 11/2004 |

* cited by examiner

ELECTROMAGNETIC WAVE SHIELDING FILTER AND PROCESS FOR PRODUCING THE SAME

FIELD OF THE INVENTION

The present invention relates to an electromagnetic wave shielding filter for preventing EMI (electromagnetic interference) that is caused by such displays as cathode ray tubes (hereinafter also referred to as CRTs) and plasma display panels (hereinafter also referred to as PDPs), and, more particularly, to an electromagnetic wave shielding filter that makes a displayed image highly visible even in the light and that can be produced in a decreased number of steps, and to a process for producing the electromagnetic wave shielding filter.

In this Specification, "ratio", "part", "%", and the like that indicate proportions are on a weight basis unless otherwise specified, and the symbol "/" denotes that layers enumerated together with this symbol are integrally laminated. Further, "NIR" and "PET" designate "near infrared rays" and "polyethylene terephthalate", respectively, and are abbreviations, synonyms, functional expressions, common designations, or terms used in the art.

BACKGROUND ART

1. Background of the Invention

Advances in the performance of electrical and electronic equipment and the growing use of the same have caused an increase in electromagnetic interference in recent years. Displays such as CRTs and PDPs emit electromagnetic waves. A PDP is an assembly composed of a glass substrate having a data electrode and a fluorescent layer, and a glass substrate having a transparent electrode. When operated, such a display not only emits visible light that produces an image, but also generates electromagnetic waves, near infrared rays, and heat in large amounts.

In general, a front panel containing an electromagnetic wave shielding filter is mounted on the front of a PDP in order to shield electromagnetic waves. The required efficiency in shielding electromagnetic waves in a frequency band of 30 MHz to 1 GHz, emitted from the front of the display, is 30 dB or more.

Further, to make an image displayed on the display highly visible, it is required that the electromagnetic wave shielding filter be not highly visible (or that the invisibility of the electromagnetic wave shielding filter be high) even in a place bright with extraneous light (sunlight, light emitted from electric lights, etc.), and that the front panel, as a whole, has moderate transparency (visible light transmission, visible light transmittance).

Furthermore, there is a demand for a production process by which the electromagnetic wave shielding filter can be produced in a decreased number of steps and with high productivity.

2. Prior Art

The following conventional processes have been usually used to produce electromagnetic wave shielding filters having metal mesh layers.

A known process for producing an electromagnetic wave shielding filter is that an electrically conductive black ink containing a black colorant is applied to a transparent substrate by intaglio offset printing to form a mesh pattern, which is then plated with a metal (see Patent Documents 1 and 2, for example). However, the electromagnetic wave shielding filter obtained in this manner is disadvantageous in that, since the metal layer present on the side opposite to the transparent substrate and the metal layer present on the side faces of the mesh reflect extraneous light and glisten, a displayed image appears white and the invisibility of the mesh is low. If a mesh made only from an electrically conductive black ink is used to impart the function of shielding electromagnetic waves in order to prevent a displayed image from appearing white and also to ensure the invisibility of the mesh, the electromagnetic wave shielding filter is to have insufficient electromagnetic wave shielding ability. Moreover, in the production process, the plating step takes a longer time because the electrically conductive ink has high electrical resistance, and this leads to low productivity.

Another known process for producing an electromagnetic wave shielding filter is as follows: a PET film (transparent substrate) and a copper layer are laminated with an adhesive layer; by a photo-etching process, this copper layer is made into a mesh consisting of a large number of openings and line parts surrounding these openings; and all of the bare portions (both faces and the side faces) of the line parts of the copper layer are subjected to blackening treatment (see Patent Document 3, for example). An electromagnetic wave shielding filter obtained in this manner shows sufficiently high electromagnetic wave shielding ability. In addition, it has improved invisibility of the mesh and increased ability to prevent a displayed image from appearing white in the light, as compared with the electromagnetic wave shielding filters containing bare metal layers, disclosed in Patent Documents 1 and 2. However, chemical conversion treatment is conducted for the blackening treatment to produce needle crystals, so that before the copper layer covered with the blackening layer is laminated to a PET film, the blackening layer falls off or is deformed, and also readily undergoes change or decrease in blackness. Moreover, since high temperature treatment is conducted, the electromagnetic wave shielding filter tends to curl, and its external appearance thus becomes poor.

A further known process for producing an electromagnetic wave shielding filter is as follows: a hydrophilic resin layer containing a paradium catalyst is formed on a transparent substrate, and a metal comprising copper or nickel is deposited on this resin layer by electroless plating, thereby forming both a blackening layer and a metal layer on the back surface of the substrate; the blackening layer and the metal layer are then photolithographically made into a mesh; and another blackening layer, a black nickel layer, is formed on the face of the mesh and the side faces of the line parts of the mesh by electroplating to blacken the whole bare line parts. In this process, the blackening layer and the metal layer are continuously formed directly on the transparent substrate, so that the blackening layer does not easily fall off or deteriorate in the course of production. This process, however, is disadvantageous in that the metal layer and the blackening layer are easily separated from the transparent substrate because the strength and adhesive power of the hydrophilic resin is weak, and in that it takes a long time to form, by plating, the metal layer with a thickness (several tens of micrometers) great enough to shield electromagnetic waves.

Patent Document 1: Japanese Laid-Open Patent Publication No. 13088/2000,

Patent Document 2: Japanese Laid-Open Patent Publication No. 59079/2000,

Patent Document 3: Japanese Laid-Open Patent Publication No. 9484/2002, and

Patent Document 4: Japanese Laid-Open Patent Publication No. 77887/2000.

SUMMARY OF THE INVENTION

The present invention was accomplished in order to solve the above-described problems in the prior art. An object of the present invention is, therefore, to provide an electromagnetic wave shielding filter that comprises a metal mesh layer whose whole bare surface has been blackened with a blackening layer so that, even in the light, the electromagnetic wave shielding filter can show moderate transparency, high electromagnetic wave shielding ability, high invisibility of the mesh, and an excellent external appearance, and can make a displayed image highly visible, and that can be produced in a shorter production time and in a smaller number of steps without falling off, damage or deterioration of the blackening layer, with the adhesion between each two constituent layers increased, and to provide a process for producing such an electromagnetic wave shielding filter.

The present invention is an electromagnetic wave shielding filter comprising a transparent substrate, a metal mesh layer with line parts that define openings of the mesh, laminated to one surface of the transparent substrate by an adhesive layer, a first blackening layer and an anticorrosive layer successively formed on transparent substrate side surfaces of the line parts of the metal mesh layer, and a second blackening layer formed on the front surfaces, on the side opposite to the transparent substrate, of the line parts of the metal mesh layer and on the side faces of the line parts.

The present invention is the electromagnetic wave shielding filter in which the second blackening layer contains a nickel alloy.

The present invention is the electromagnetic wave shielding filter in which the first blackening layer contains a nickel-chromium alloy.

The present invention is the electromagnetic wave shielding filter in which the first blackening layer contains a copper-cobalt alloy, and the second blackening layer contains a nickel alloy.

The present invention is the electromagnetic wave shielding filter in which the anticorrosive layer contains a chromium compound.

The present invention is the electromagnetic wave shielding filter in which the anticorrosive layer contains chromium and/or zinc.

The present invention is the electromagnetic wave shielding filter in which the anticorrosive layer contains a metal other than chromium.

The present invention is a process for producing an electromagnetic wave shielding filter comprising a transparent substrate and a metal mesh layer with line parts that define openings of the mesh, laminated to one surface of the transparent substrate by an adhesive layer, comprising the steps of preparing a transparent substrate and a metal layer, successively forming a first blackening layer and an anticorrosive layer on one surface of the metal layer, laminating the metal layer, the first blackening layer and the anticorrosive layer to the transparent substrate by an adhesive layer with the anticorrosive layer facing to the transparent substrate, photolithographically making, into a mesh, the anticorrosive layer, the first blackening layer and the metal layer that have been laminated to the transparent substrate, thereby forming, in the metal layer, line parts that define openings of the mesh, and forming a second blackening layer on surfaces, on the side opposite to the transparent substrate, of the line parts of the metal layer and on side faces of the line parts.

The present invention is the process for producing an electromagnetic wave shielding filter, in which the step of forming the first blackening layer comprises deposition of a copper-cobalt alloy by electroplating, and the step of forming the second blackening layer comprises deposition of a nickel alloy by electroplating.

The present invention is the process for producing an electromagnetic wave shielding filter, in which the step of forming the anticorrosive layer comprises chromate treatment.

The present invention is the process for producing an electromagnetic wave shielding filter, in which the transparent substrate comprises a polyethylene terephthalate film, and the step of laminating the anticorrosive layer and the transparent substrate comprises dry lamination.

According to the present invention, the electromagnetic wave shielding filter has moderate transparency and high electromagnetic wave shielding ability, and a blackening layer is formed on the whole bare line parts. There is, therefore, provided an electromagnetic wave shielding filter that is excellent in the invisibility of the mesh and also in image contrast in the presence of extraneous light, and that can make a displayed image highly visible. Further, since an anticorrosive layer is formed on the blackening layer that is present on the transparent substrate side, this blackening layer does not fall off and undergoes no decrease or change in blackness in the step of laminating the transparent substrate and the metal layer. There is also provided an electromagnetic wave shielding filter that can fully show the required performance even in the presence of extraneous light, and in which the metal layer and the blackening layer are firmly laminated to the transparent substrate by an adhesive.

The present invention provides an electromagnetic wave shielding filter comprising a well-blackened mesh with high invisibility, capable of making image contrast high and a displayed image highly visible even in the presence of extraneous light.

The present invention provides a highly durable electromagnetic wave shielding filter whose metal layer is hard to rust.

The present invention provides an electromagnetic wave shielding filter capable of ensuring good adhesion between the anticorrosive layer and the blackening layer.

The present invention provides a process for producing an electromagnetic wave shielding filter, in which a blackening layer can be easily formed on the entire surfaces of the line parts of the mesh, and by which an electromagnetic wave shielding filter can be produced in a short time and in a small number of steps.

The present invention provides a process for producing an electromagnetic wave shielding filter that is blacker than ever and whose blackening layer is hard to fall off.

The present invention provides a process for producing, with ease, an electromagnetic wave shielding filter excellent in anticorrosive effect.

The present invention provides a process for easily producing, using a thin transparent substrate and the existing technique and equipment, an electromagnetic wave shielding filter that can form a front panel for a PDP when combined with other optical members such as a near infrared ray shielding material, an antireflection material and/or an anti-glaring material.

BEST MODE FOR CARRYING OUT THE INVENTION

Embodiments of the present invention will be hereinafter described in detail with reference to the accompanying drawings.

Figure 1:
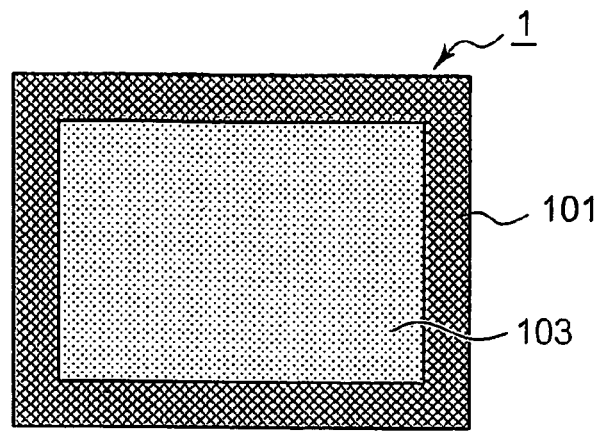
FIG. 1 is a plane view showing an embodiment of an electromagnetic wave shielding filter according to the present invention.

FIG. 1 a plane view showing an electromagnetic wave shielding filter according to the present invention.

Figure 2:
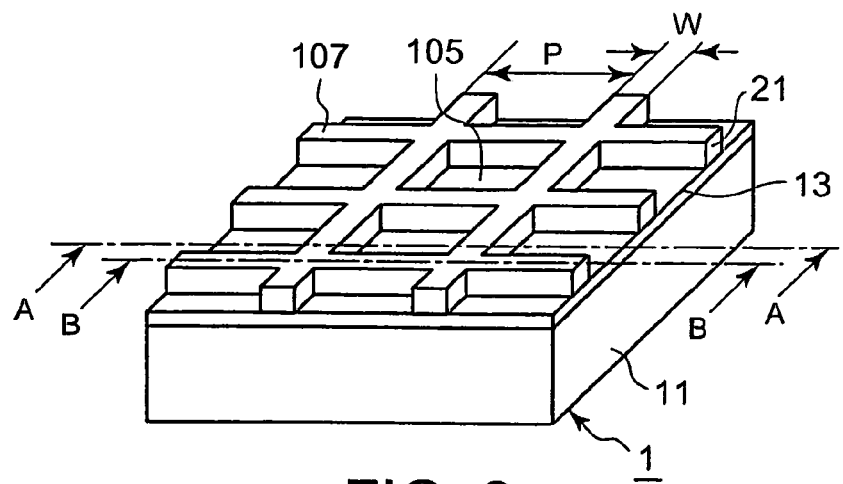
FIG. 2 is a perspective view of the mesh part shown in FIG. 1.

FIG. 2 is an enlarged perspective view of the mesh part shown in FIG. 1.

Figure 3:
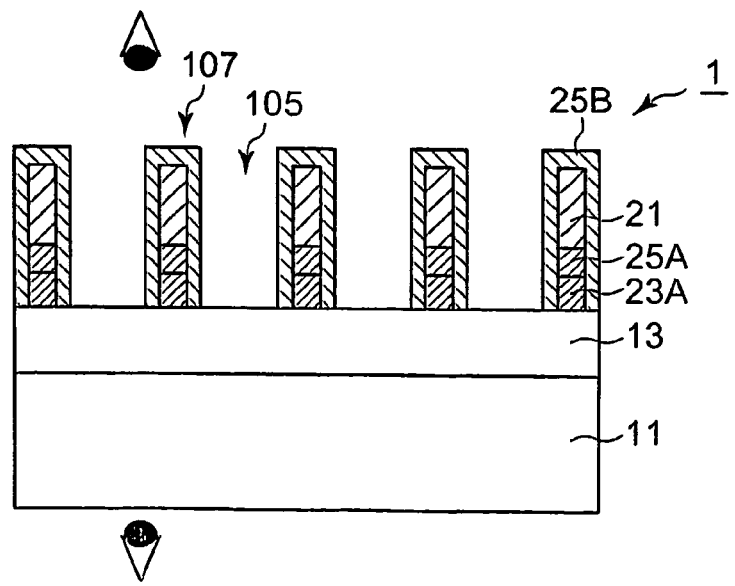
FIG. 3 is a sectional view of the mesh part, showing an embodiment of an electromagnetic wave shielding filter according to the present invention.

FIG. 3 is a sectional view of the mesh part of an electromagnetic wave shielding filter according to the present invention.

Figure 4:
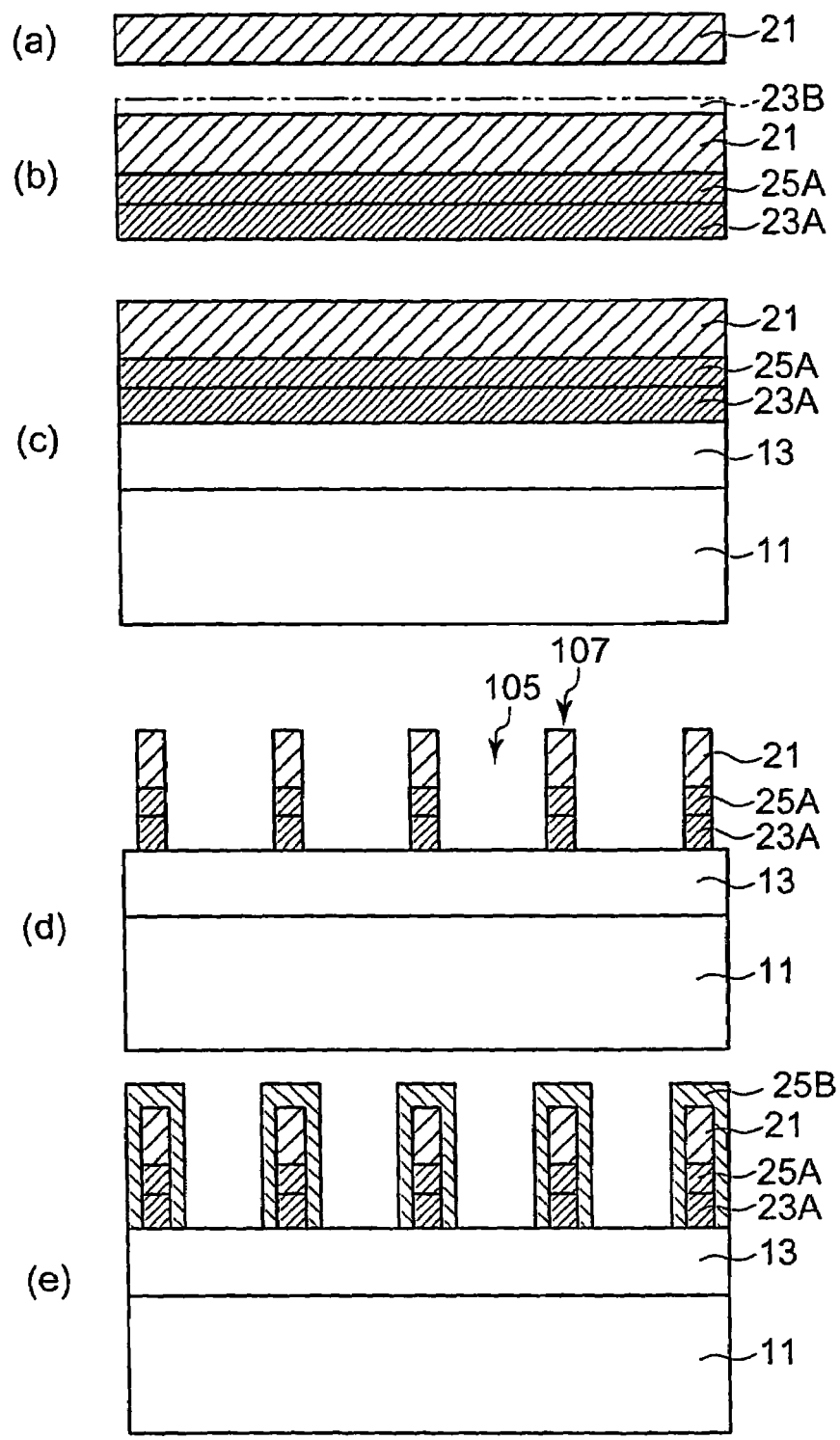
FIG. 4 is a sectional view illustrating the flow of steps in a process for producing an electromagnetic wave shielding filter according to the present invention.

FIG. 4 is a sectional view illustrating the flow of steps in a process for producing an electromagnetic wave shielding filter according to the present invention.

(Basic Process) A process for producing an electromagnetic wave shielding filter according to the present invention is for producing an electromagnetic wave shielding filter by providing, through an adhesive layer at least on one surface of a transparent substrate 11, a metal mesh layer 21 with line parts 107 that define two-dimensionally arranged multiple openings 105 of the mesh. The whole bare metal layer 21, that is, the front, back and side faces of the line parts 107, have been subjected to blackening treatment. As shown in FIGS. 4(*a*) to 4(*e*), this production process comprises (1) the step of preparing a metal layer 21, (2) the step of forming a first blackening layer 25A and an anticorrosive layer 23A on one surface of the metal layer 21, (3) the step of laminating the anticorrosive layer 23A and the transparent substrate 11 with an adhesive layer 13, (4) the step of photolithographically making, into a mesh pattern, the anticorrosive layer 23A, the first blackening layer 25A, and the metal layer 21 that have been laminated to the transparent substrate 11, and (5) the step of subjecting the mesh pattern to blackening treatment to form on it a second blackening layer 25B.

(Basic Components) As shown in FIGS. 1 to 3, an electromagnetic wave shielding sheet 1 comprises a transparent substrate 11, and a metal mesh layer 21 formed on one surface of the transparent substrate 11 through an adhesive layer 13. The metal mesh layer 21 has line parts 107 that define openings 105 of the mesh. A first blackening layer 25A and an anticorrosive layer 23A are successively formed on the surfaces, on the transparent substrate 11 side, of the line parts 107 of the metal mesh layer 21, and a second blackening layer 25B is formed on the surfaces front surfaces, on the side opposite to the transparent substrate 11, of the line parts 107 and also on the side faces of the line parts 107.

The transparent substrate 11 includes a mesh part 103 and a frame part 101 surrounding the mesh part 103. The mesh part 103 is made of a laminate of the anticorrosive layer 23A/the first blackening layer 25A/the metal mesh layer 21/the second blackening layer 25B, and the frame part 101 is made of a laminate of the anticorrosive layer 23A/the first blackening layer 25A/the non-meshed metal layer 21/the second blackening layer 25B.

The line parts 107 and the openings 105 of the mesh part 103 correspond to the line parts and the openings of the metal mesh layer 21.

(First Step) The step of preparing the metal layer (FIG. 4(*a*)).

(Metal Layer) A metal having electrical conductivity good enough to fully shield electromagnetic waves, such as gold, silver, copper, iron, nickel, chromium, or aluminum, may be used for the metal layer 21. The metal layer 21 may be a layer of either one metal or an alloy, or may also be composed of multiple layers. Examples of iron materials herein useful for the metal layer 21 include low-carbon steels such as low-carbon rimmed steels and low-carbon aluminum killed steels, Ni—Fe alloys, and invar alloys. If cathodic electrodeposition is conducted as blackening treatment, it is preferable to use copper or copper alloy foil as the metal layer 21 because it is easy to electrodeposit a blackening layer on such a material.

Although both rolled copper foil and electrolytic copper foil can be used as the copper foil, electrolytic copper foil is preferred because of its uniformity in thickness and adhesion to the blackening layer and because it can have a thickness as small as below 10 µm. The thickness of the metal layer 21 is approximately from 1 to 100 µm, and preferably from 5 to 20 µm. If the metal layer 21 has a thickness smaller than the above range, although it is easy to photolithographically process the metal layer 21 into a mesh, the metal layer has an increased electrical resistance value and thus shows impaired electromagnetic wave shielding effect. When the metal layer 21 has a thickness exceeding the above range, it is impossible to make the metal layer 21 into a mesh with the desired minute openings. Consequently, the mesh has a low substantial opening rate, resulting in a lower light transmission rate, a narrower viewing angle, and lower image visibility.

The surface roughness of the metal layer 21 is preferably from 0.5 to 10 µm as indicated by the Rz value. If the metal layer 21 has a surface roughness of less than 0.5 µm, it reflects extraneous light by mirror reflection even if blackened, and thus makes image visibility lower. If the surface roughness of the metal layer 21 is more than 10 µm, an adhesive or resist, upon application thereof, does not spread over the entire surface of the metal layer, or involves air to produce air bubbles. The surface roughness Rz is herein a mean value of 10 measurements obtained in accordance with JIS-B0601.

(Second Step) The step of forming the first blackening layer 25A and the anticorrosive layer 23A on one surface of the metal layer 21.

A second anticorrosive layer 23B may optionally be formed on the metal layer 21 surface on the side opposite to the side on which the first blackening layer 25A and the anticorrosive layer 23A are formed (FIG. 4(*b*)).

(First Blackening Layer) When such a production process that a metal layer 21 that has been formed in advance and a transparent substrate 11 are laminated with an adhesive layer 13 is employed, the formation of the first blackening layer 25A, that is, blackening treatment, cannot be conducted after laminating the two members, so that this treatment is conducted when the metal layer 21 is still in the form of a single layer. The blackening treatment may be conducted by roughening and/or blackening the surface of the metal layer, and the deposition of a metal, alloy, metallic oxide or metallic sulfide, or any of other various methods can be employed for this purpose. Preferred methods for conducting the blackening treatment include plating, vacuum deposition, and sputtering. If the blackening treatment is conducted by plating, it is possible to form a blackening layer on the metal layer with good adhesion and to uniformly blacken the surface of the metal layer with ease. At least one metal selected from copper, cobalt, nickel, zinc, molybdenum, tin, and chromium, or a compound containing the metal is used as plating material. When other metals or compounds are used, the metal layer cannot be fully blackened, or the blackening layer is poor in adhesion to the metal layer. This is significant when cadmium, for example, is used for plating.

The reason why the blackening layer (the first blackening layer 25A) is formed only on the back surface of the metal layer 21 at the stage before the step of lamination (the third step) is as follows. Namely, since the back surface (the surface on the transparent substrate 11 side) of the metal layer 21 is processed into a mesh pattern after laminating the metal layer 21 to the transparent substrate 11, it is impossible to form the first blackening layer 25A after the step of processing the metal layer 21 into a mesh pattern (the fourth step). It is, therefore, necessary to complete the formation of the first blackening layer 25A at the stage before the step of lamination. The formation of the blackening layer on the surface (on the side opposite to the transparent substrate 11) of the metal layer 21 can be conducted either before or after the step of lamination. However, when the fact that the formation of the blackening layer on the side faces of the line parts 107 can be conducted only after laminating the metal layer to the transparent substrate and processing the laminate into a mesh pattern (the openings 105 and the side faces of the line parts 107 do not appear until this stage) is taken into consideration, if the formation of the blackening layer on the surface of the metal layer is conducted before the step of lamination, it is necessary to repeat the formation of the blackening layer three times (on the back surface, on the face, and on the side faces). On the other hand, if the formation of the blackening layer on the surface of the metal layer is conducted after the step of processing the laminate into a mesh pattern, it is necessary to repeat the formation of the blackening layer only twice (on the back surface, and on the face simultaneously with on the side faces). Therefore, to shorten the length of the process and to simplify the process, it is preferable to form the first blackening layer 25A only on the back surface of the metal layer 21 at the stage before the step of lamination.

In the case where copper foil is used as the metal layer 21, preferred examples of materials for the first blackening layer 25A include copper-cobalt alloys and nickel-chromium alloys. In the case of a copper-cobalt alloy, a plating process is employed to form the first blackening layer 25A, where particles of the alloy form the layer. The plating process that can be used herein includes cathodic electrodeposition plating in which copper foil is subjected to cathodic electrolysis in an electrolyte such as sulfuric acid, copper sulfate, or cobalt sulfate, thereby depositing cationic particles on the copper foil. The cationic particles deposited roughen the surface of the metal layer and form the first blackening layer 25A that is black in color. Although the cationic particles may be either copper particles or particles of an alloy of copper and another metal, copper-cobalt alloy particles are preferred. The mean particle diameter of copper-cobalt alloy particles is preferably from 0.1 to 1 µm. Cathodic electrodeposition is convenient to deposit uniformly sized particles with a mean particle diameter of 0.1 to 1 µm. Further, if treated at high current density, the surface of copper foil becomes cathodic, generates reducing hydrogen, and is thus activated, so that significantly improved adhesion can be obtained between the copper foil and the particles.

In the case where the mean particle diameter of the copper-cobalt alloy particles is outside the above-described range, for example, when the mean particle diameter of the copper-cobalt alloy particles is greater than the above range, the degree to which the metal layer is blackened is lower, and falling of the particles (falling of the powdery coating) easily occurs. Moreover, the external appearance of the agglomerated particles becomes poor in denseness, and the non-uniformity of the external appearance and that of light absorption become noticeable. Also when the mean particle diameter of the copper-cobalt alloy particles is less than the above-described range, the metal layer is insufficiently blackened. Such a metal layer cannot fully prevent reflection of extraneous light, so that image visibility becomes lower. It is also preferable to conduct the blackening treatment by using black chromium or black nickel because such a metal is excellent in both electrical conductivity and blackness, and its particles do not fall off.

A nickel-chromium alloy can be deposited on the metal layer by such a method as plating, vacuum deposition, or sputtering. Since nickel-chromium alloys are excellent in adhesion to copper and have high electrical conductivity, they are advantageous also from the viewpoint of electromagnetic wave shielding ability.

(Anticorrosive Layer) Next, the anticorrosive layer 23A is formed on the surface of the first blackening layer 25A. The anticorrosive layer 23A has the function of protecting the surfaces of the metal layer 21 and the first blackening layer 25A from corrosion, the function of preventing falling or deformation of those particles that form the first blackening layer 25A, and the function of making the blackness of the first blackening layer 25A higher. The reason why the anticorrosive layer 23A is thus formed is as follows. Namely, it is necessary to form the anticorrosive layer 23A prior to the step of lamination (the third step) in order to prevent falling and deterioration of the first blackening layer 25A before the first blackening layer 25A is laminated to the transparent substrate 11.

Although any conventional anticorrosive layer may be used as the anticorrosive layer 23A, a layer of such a metal as chromium, zinc, nickel, tin or copper, a layer of any alloy of these metals, a layer of any oxide of these metals, or a layer of a chromium compound is suitably used, and a chromium compound layer obtained by conducting zinc plating and then chromate treatment is preferably used. Further, it is preferable that the anticorrosive-layer 23A contains a-silica compound so as to show increased acid resistance at the time when etching or rinsing with an acid is effected. Examples of the silica compound include silane coupling agents. The anticorrosive layer 23A is excellent in adhesion to the first blackening layer 25A (especially, a layer of copper-cobalt alloy particles) and also in adhesion to the adhesive layer 13 (especially, a two-part curing urethane resin adhesive layer). When the anticorrosive layer 23A contains nickel and the nickel exhibits passivity, the adhesion between the anticorrosive layer 23A and the second blackening layer 25B can become weak, and the second blackening layer 25B can thus become easy to fall off. A metal such as chromium, zinc, nickel, tin or copper, any alloy of these metals, or any oxide of these metals can be deposited by a known process of plating. To deposit a chromium compound, a conventional plating process, chromate (a salt of chromic acid) treatment, or the like is employed. The thickness of the anticorrosive layer 23A is approximately from 0.001 to 10 μm, preferably from 0.01 to 1 μm.

To form the anticorrosive layer 23A by the chromate treatment, coating or flow coating is effected. An anticorrosive layer may be formed only on one surface of the metal layer 21, or anticorrosive layers may be formed on both surfaces of the metal layer 21 by dipping. In the case where anticorrosive layers have been formed on both surfaces of the metal layer 21 simultaneously, the anticorrosive layer present on the first blackening layer 25A surface is referred to as an anticorrosive layer 23A, and the anticorrosive layer present on the metal layer 21 surface, a second anticorrosive layer 23B. In general, however, when anticorrosive layers have been formed on both surfaces of the metal layer by dipping, although the second anticorrosive layer 23B contains no nickel, it is preferable to remove the second anticorrosive layer 23B present on the metal layer 21 surface by the use of an aqueous acid solution or the like prior to conducting second blackening treatment.

Namely, since the second anticorrosive layer 23B has a chemically inactive surface or inhibits the deposition of a metal oxide layer on its surface, the adhesion of the second blackening layer 25B to the second anticorrosive layer 23B is weak. For this reason, it is necessary to remove the second anticorrosive layer 23B.

(Chromate Treatment) Chromate treatment is that a chromate treatment liquid is applied to an object to be treated. For the application of a chromate treatment liquid, a roll, curtain, squeeze, electrostatic spray, or dip coating method, for example, can be employed, and the chromate treatment liquid applied is not washed away with water but is dried as it is. An aqueous solution containing chromic acid is usually used as the chromate treatment liquid. Specific examples of the chromate treatment liquid include Alsurf 1000 (trademark of a chromate treatment agent, manufactured by Nippon Paint Co., Ltd., Japan), and PM-284 (trademark of a chromate treatment agent, manufactured by Nippon Parkerizing Co., Ltd., Japan). It is preferable to conduct zinc plating prior to the chromate treatment, and the resulting structure, that is, the first blackening layer/the anticorrosive layer (two layers of zinc layer/chromate treatment layer), can increase ply adhesion, enhance the resistance to corrosion, and improve the blackening effect.

(Third Step) The step of laminating the anticorrosive layer 23A and the transparent substrate 11 with an adhesive (FIG. 4(c)).

(Transparent Substrate) Any of various materials can be used for the transparent substrate 11 as long as it has transparency, insulating properties, heat resistance, mechanical strength, and so on that can stand for service and production conditions. Examples of materials useful herein include glass and transparent resins. Glass includes silica glass, borosilicate glass and soda-lime glass, and it is preferable to use non-alkali glass containing no alkali components, having a low rate of thermal expansion, being excellent in dimensional stability and also in working properties at high-temperature heat treatment. The transparent substrate 11 may be made to serve also as a substrate for an electrode.

Examples of transparent resins herein useful include polyester resins such as polyethylene terephthalate, polybutylene terephthalate, polyethylene naphthalate, terephthalic acid-isophthalic acid-ethylene glycol copolymers, and terephthalic acid-cyclohexane dimethanol-ethylene glycol copolymers; polyamide resins such as nylon 6; polyolefin resins such as polypropylene and polymethyl pentene; acrylic resins such as polymethyl methacrylate; styrene resins such as polystyrene and styrene-acrylonitrile copolymers; cellulose resins such as triacetyl cellulose; imide resins; and polycarbonate. A sheet, film, plate or the like of any of these resins can be used as the transparent substrate 11.

The transparent-resin-made transparent substrate 11 may be made from any one of the above-enumerated resins or a mixture (including an alloy) of two or more of the above resins, or may be a laminate of a plurality of layers. Although the transparent substrate may be either an oriented film or a non-oriented film, a mono- or bi-axially oriented film is preferably used in order to obtain increased strength. The thickness of the transparent substrate is usually about 12 to 1000 μm, preferably 50 to 700 μm, and most preferably 100 to 500 μm, when the transparent substrate is made from a transparent resin. In the case where the transparent substrate is made of glass, the preferred thickness of the transparent substrate is usually about 1000 to 5000 μm. In either case, a transparent substrate with a thickness of less than the above range cannot have sufficiently high mechanical strength, so that it curls, becomes wavy, or is broken; while a transparent substrate with a thickness of more than the above range has excessively high strength, which is wasteful from the viewpoint of cost.

In general, a film of a polyester resin such as polyethylene terephthalate or polyethylene naphthalate, or a plate of an acrylic resin or glass is conveniently used as the transparent substrate because it is excellent in both transparency and heat resistance and is inexpensive. A biaxially oriented polyethylene terephthalate film is most preferred because it is hard to break, is light in weight, and is easy to shape. Although the higher the transparency of the transparent substrate 11, the better, it is preferable that the transparent substrate 11 has a transmittance of 80% or more for visible light.

The surface of the transparent substrate 11 to be coated with an adhesive layer 13 may be subjected to adhesion-improving treatment such as corona discharge treatment, plasma treatment, ozone treatment, flame treatment, primer (also referred to as an anchoring, adhesion-promoting or adhesion-improving agent) coating treatment, preheating treatment, dust-removing treatment, vacuum deposition, or alkali treatment. Additives such as ultraviolet light absorbers, fillers, plasticizers, and antistatic agents may also be incorporated in the transparent substrate 11, as needed.

(Lamination Process) The transparent substrate 11, and the anticorrosive layer 23A of the above-described laminate of the anticorrosive layer 23A/the first blackening layer 25A/the metal layer 21 are laminated with an adhesive. The process of this lamination is as follows: a resin serving as an adhesive or pressure-sensitive adhesive, or a mixture of such resins, is made into a fluid such as a hot melt, a non-crosslinked polymer, a latex, an aqueous dispersion, or an organic solvent solution, which is then printed on or applied to the transparent substrate 11 and/or the anticorrosive layer 23A by a conventional printing or coating method such as screen printing, gravure printing, comma coating, or roll coating, and is dried, if necessary; the other member is superposed on this adhesive layer, and pressure is applied; and the adhesive (pressure-sensitive adhesive) layer is then hardened. The thickness of the adhesive layer is approximately from 0.1 to 20 μm (dry basis), preferably from 1 to 10 μm.

Specifically, continuous belt-shaped (rolled-up) materials are usually used in the lamination process; the adhesive is applied to the laminated structure including the metal layer in the state of being unrolled from a wind-up roll and stretched, and is then dried; the substrate is superposed on this adhesive layer, and pressure is applied. It is preferable to use a process that is called dry lamination by those skilled in the art. Further, it is preferable to use ionizing radiation curing resins that cure (react) in ionizing radiation such as ultraviolet light (UV) or electron beams (EB).

(Dry Lamination) Dry lamination is a process for laminating two materials in the following manner: by a coating method such as roll, reverse roll or gravure coating, an adhesive dispersed or dissolved in a solvent is applied to one laminating material so that the layer applied has a thickness of approximately 0.1 to 20 μm (dry basis), preferably 1 to 10 μm, and the solvent is evaporated to form an adhesive layer; immediately after the formation of the adhesive layer, the other laminating material is superposed on the adhesive layer; and the laminate obtained is aged at 30 to 80° C. for several hours to several days to harden the adhesive. The adhesive that can be used in the dry lamination process includes thermosetting adhesives and ionizing radiation curing adhesives that cure in ionizing radiation such as ultraviolet light or electron beams. Specific examples of thermosetting adhesives useful herein include two-part curing urethane adhesives that are obtained by the reaction of polyfunctional isocyanates such as tolylene diisocyanate or hexamethylene diisocyanate with hydroxyl-group-containing compounds such as polyether polyols or polyacrylate polyols; acrylic adhesives; and rubber adhesives. Of these, two-part curing urethane adhesives are preferred.

(Fourth Step) The step of photolithographically making, into a mesh pattern, the anticorrosive layer 23A, the first blackening layer 25A and the metal layer 21 that have been laminated to the transparent substrate 11 (FIG. 4(d)).

The anticorrosive layer 23A/the first blackening layer 25A/the metal layer 21 in the laminate of the transparent substrate 11/the adhesive layer 13/the anticorrosive layer 23A/the first blackening layer 25A/the metal layer 21 is photolithographically made into a mesh pattern.

(Photolithographic Process) A mesh-patterned resist layer is formed on the surface of the metal layer 21 in the laminate; those portions of the metal layer/the first blackening layer/the anticorrosive layer that are not covered with the resist layer are removed by etching; and the resist layer is then stripped, thereby obtaining an electromagnetic wave shielding layer in a mesh pattern. As shown in FIG. 1, a plane view, the electromagnetic wave shielding layer is composed of a mesh part 103 and a frame part 101 that is optionally provided around the mesh part 103. As shown in FIG. 2, a perspective view, and in FIG. 3, a sectional view, the mesh part 103 has line parts 107, the remaining metal layer, by which a plurality of openings 105 are defined, while the frame part 101 has no openings and its entire surface is the surface of the non-etched metal layer 21. The frame part 101 is optional and may be provided in the whole area surrounding the mesh part 103 or at least in a part of this area.

Also the above-described process includes the step of processing a belt-shaped laminate in the state of a continuously wound-up roll. While unwinding and transferring the laminate either continuously or intermittently, masking, etching, and resist stripping are conducted with the laminate stretched and non-loosened. First, masking is conducted in the following manner: a photosensitive resist, for example, is applied to the metal layer 21 and is dried; this resist is subjected to contact exposure, using an original plate with a predetermined pattern (composed of the line parts of the mesh part and the frame part); thereafter, development with water, film-hardening treatment, and baking are conducted. The application of a resist is conducted in the following manner: while continuously or intermittently unwinding and transferring the belt-shaped, wound-up laminate, a resist such as casein, PVA, or gelatin is applied to the metal layer 21 surface of the laminate by such a method as dipping (immersion), curtain coating, or flow coating.

Alternatively, a dry film resist may be used instead of applying a photosensitive resist. The use of a dry film resist improves working properties. When casein is used as the resist, baking is usually conducted at a temperature between 100° C. and 300° C.

(Etching) The masked laminate is etched. In the present invention in which etching is conducted continuously, it is preferable to use, as an etchant, an aqueous solution of ferric chloride or cupric chloride that can be readily circulated. Further, etching is conducted by the use of basically the same facilities as those used for the production of shadow masks for cathode ray tubes of color TV, in which belt-shaped continuous steel stock, especially a thin plate with a thickness of 20 to 80 μm, is etched. Namely, the existing facilities for producing shadow masks can be used, and a series of the steps of from masking to etching can be continuously effected, so that the production efficiency is significantly high. After etching, the laminate is washed with water, subjected to resist stripping using an alkaline solution, cleaned, and then dried.

(Removal of Second Anticorrosive Layer) In the case where the second anticorrosive layer 23B is formed on the non-first-blackening-layer-formed surface of the metal layer 21 opposite to the transparent substrate, this layer 23B can impede the lamination of the second blackening layer 25B depending upon the material for the second anticorrosive layer 23B. In this case, it is preferable to remove the second anticorrosive layer 23B after stripping the resist, before the formation of the second blackening layer 25B. The second anticorrosive layer 23B can be removed with an acid or alkaline solution.

(Mesh) The mesh part 103 is an area surrounded by the frame part 101. The mesh part 103 has line parts 107 that define a plurality of openings 105. The openings 105 are not limited in shape (pattern of meshes), and the shape of the openings 105 may be a triangle such an equilateral triangle, a square such as a regular square, rectangular, rhombus or trapezoid, a polygon such as a hexagon, a circle, an oval, or the like. These openings 105 make up the mesh part. From the viewpoint of the opening rate and the invisibility of the mesh part, it is preferable that the width of the line parts 107 be 50 μm or less, preferably 20 μm or less. From the viewpoint of light transmittance, it is preferable that the distance between each two line parts 107 (line pitch) be 150 μm or more, preferably 200 μm or more. In order to avoid the occurrence of moire fringes or the like, the angle of bias (the angle between the line parts of the mesh part and the sides of the electromagnetic wave shielding sheet) may be properly selected with consideration for the pixel and emission properties of a display.

(Fifth Step) By subjecting the mesh pattern to blackening treatment, the face front surface of the metal layer 21, the side faces of the metal layer 21, the side faces of the first blackening layer 25A, and the side faces of the anticorrosive layer 23A are covered with the second blackening layer 25B, as shown in FIG. 4(e).

(Second Blackening Layer) The second blackening layer 25B may be formed by the use of the same material and method as those used for forming the first blackening layer 25A. Preferably, black chromium, black nickel, or a nickel alloy is used, and a nickel-zinc, nickel-tin or nickel-tin-copper alloy is used as the nickel alloy. Nickel alloys are excellent particularly in electrical conductivity and blackness. Further, the second blackening layer 25B can be made to have not only a blackening effect but also the function of preventing corrosion of the metal layer 21.

The particles that form the blackening layer are usually in the shape of needles, so that they are readily deformed by external force and undergo changes in external appearance. However, particles of a nickel alloy are not easily deformed and form the bare second blackening layer 25B that can be processed with ease in the later step. It is, therefore, more preferable to use a nickel alloy. To deposit a nickel alloy, a conventional electroplating or electroless plating process is employed. A nickel alloy may be deposited after conducting nickel plating.

(Blackening Treatment) By thus conducting the blackening treatment, it is possible to blacken not only the faces front surfaces but also the side faces of the line parts 107 of the metal mesh layer 21. Consequently, the mesh pattern of the metal layer 21 is entirely covered with the blackening layer, and the metal layer 21 can, therefore, shield electromagnetic waves emitted from a PDR Moreover, since the blackening layer prevents reflection, from the line parts of the metal mesh for shielding electromagnetic waves, of extraneous light such as light from fluorescent lamps and of display light emitted from a PDP, it is possible to view a good-conditioned, high-contrast image on the display.

In this Specification, surface roughening, and blackening by increasing absorption of light in the whole visible light range are referred collectively to as blackening treatment. The reflection Y value of the blackening layer is approximately 15 or less, preferably 5 or less, more preferably 2.0 or less. The reflection Y value was measured by a spectrophotometer UV-3100PC (manufactured by Shimadzu Corp., Japan) at an angle of incidence of 5° (wavelength: 380-780 nm).

A combination of the electromagnetic wave shielding filter (electromagnetic wave shielding sheet) of the present invention and other optical members can be used as a favorable front panel for a PDP. For example, a combination of the electromagnetic wave shielding sheet and an optical member having the function of absorbing near infrared rays absorbs near infrared rays emitted from a PDP, so that it can prevent malfunction of remote-control apparatus, optical communication apparatus, and the like that are being used near the PDP. Further, a combination of the electromagnetic wave shielding sheet and an optical member having the function of preventing reflection and/or glaring of light does not reflect both display light from a PDP and extraneous light externally incident on the PDP, so that it can improve image visibility.

In the case where the frame part 101 is provided, this part is also blackened simultaneously with the mesh part, so that the display seems high class. Moreover, since both surfaces of the electromagnetic wave shielding layer of the electromagnetic wave shielding filter of the present invention are black in color, the electromagnetic wave shielding filter can be mounted on a PDP with either surface facing to the PDP.

Furthermore, in the case where a flexible material is used for the transparent substrate 11, it is possible to process, in every step, a belt-shaped, continuously rolled-up (wound-up) laminate while continuously or intermittently unwinding and transferring the laminate. Therefore, the electromagnetic wave shielding filter can be produced in a smaller number of steps (two or more steps being put together) with high productivity.

Modified Embodiment

The present invention encompasses the following modification.

After obtaining the electromagnetic wave shielding filter 1 shown in FIG. 3, the surface of the mesh part 103 that is rough due to the line parts 107 and the openings 105 may be smoothened by filling the openings 105 with a transparent resin. If the surface of the mesh part 103 is smoothened in this manner, air bubbles never remain in the openings 105 when the mesh part of the electromagnetic wave shielding filter and another member (a transparent substrate, a near infrared ray absorbing filter, an antireflection filter, or the like) are laminated with an adhesive layer in the later step. It is thus possible to avoid lowering of the sharpness of a displayed image that occurs if air bubbles remain in the openings and scatter light.

EXAMPLES

The present invention will now be explained more specifically by way of Examples and Comparative Examples. However, the present invention is not limited to the following Examples.

Example 1

Electrolytic copper foil with a thickness of 10 μm was used as the metal layer 21. Copper-cobalt alloy particles (mean particle diameter: 0.3 μm) were cathodically electrodeposited on one surface of the metal layer 21, thereby forming a first blackening layer 25A. After effecting zinc plating, conventional chromate treatment was conducted by dipping to make both surfaces of the metal layer 21 anticorrosive. The anticorrosive layer present on the first blackening layer 25A surface is herein referred to as an anticorrosive layer 23A, and the anticorrosive layer present on the metal layer surface, a second anticorrosive layer 23B.

The anticorrosive layer 23A on the side of the first blackening layer 25A and a transparent substrate 11 made of a PET film A4300 (trademark of a polyethylene terephthalate film, manufactured by Toyobo Co., Ltd., Japan) with a thickness of 100 μm were laminated with an adhesive layer 13 of a two-part curing urethane adhesive, and this laminate was aged at 50° C. for 3 days, thereby obtaining a laminate. For the adhesive, Takelack A-310 (trademark, manufactured by Takeda Chemical Industries, Ltd., Japan) consisting of polyester urethane polyol was used as the main agent, and Takenate A-10 (trademark, manufactured by Takeda Chemical Industries, Ltd., Japan) consisting of xylene diisocyanate, as the curing agent. The adhesive was applied in such an amount that the dry adhesive layer had a thickness of 7 μm.

The anticorrosive layer 23A/the first blackening layer 25A/the metal layer 21/the second anticorrosive layer 23B in the above laminate was photolithographically made into a mesh pattern.

Using the existing production line for shadow masks for color TV, the laminate in the form of a belt-shaped (rolled-up) continuous web was subjected to a series of the steps of from masking to etching. First, a casein photosensitive resist was applied to the entire surface of the second anticorrosive layer in the laminate by dipping. This laminate was intermittently transferred to the next station, where contact exposure to ultraviolet light from a mercury vapor lamp was conducted by the use of a negative pattern plate for forming a mesh part 103 having line parts with a line width of 22 μm, a line distance (pitch) of 300 μm, and an angle of bias of 49 degrees, the line parts defining regular-square openings, and a frame part 101 with a width of 15 mm, surrounding the mesh part 103. The exposed laminate was then transferred from one station to another for development with water, for film-hardening treatment, and for baking by heating. The baked laminate was further transferred to the next station, where etching was conducted by spraying, as an etchant, an aqueous ferric chloride solution over the laminate to make openings in the laminate. This laminate was then transferred from one station to another for washing with water, for resist stripping, for cleaning, and for drying by warm air, thereby forming the mesh part.

Thereafter, the mesh part was subjected to second blackening treatment. The laminate was firstly immersed in a 3% aqueous sulfuric acid solution bath for 10 seconds to remove the second anticorrosive layer 23B. An aqueous solution mixture of an aqueous ammonium solution of nickel sulfate, an aqueous solution of zinc sulfate, and an aqueous solution of sodium thiosulfate was prepared as a plating bath for blackening treatment. The laminate was immersed in this aqueous solution mixture, and electroplating was conducted to deposit a nickel-zinc alloy on the laminate as a second blackening layer 25B. As shown in FIG. 3, the face front surface of the metal layer 21, the side faces of the metal layer 21, the side faces of the first blackening layer 25A, and the side faces of the anticorrosive layer 23A were covered with the second blackening layer 25B. Thus, there was obtained an electromagnetic wave shielding filter 1 whose cross section was as shown in FIG. 3.

Example 2

An electromagnetic wave shielding filter 1 was obtained in the same manner as in Example 1, except that electroplating was conducted by immersing the laminate in an aqueous solution mixture of an aqueous ammonium solution of nickel sulfate, an aqueous solution of tin sulfate and an aqueous solution of sodium thiosulfate, serving as a plating bath for blackening treatment, thereby depositing a nickel-tin alloy as the second blackening layer 25B.

Example 3

An electromagnetic wave shielding filter 1 was obtained in the same manner as in Example 1, except that electroplating was conducted by immersing the laminate in an aqueous solution mixture of an aqueous ammonium solution of nickel sulfate, an aqueous solution of tin sulfate, an aqueous solution of copper sulfate and an aqueous solution of sodium thiosulfate, serving as a plating bath for blackening treatment, thereby depositing a nickel-tin-copper alloy as the second blackening layer 25B.

Example 4

An electromagnetic wave shielding filter 1 was obtained in the same manner as in Example 1, except that instead of conducting zinc plating and chromate treatment, plating was conducted to deposit a chromium-zinc alloy as the anticorrosive layer. Since the zinc contained in the anticorrosive layer made from the chromium-zinc alloy had been eluted in the step of washing with an alkali effected for stripping the resist layer, the second anticorrosive layer contained no zinc but chromium only.

Comparative Example 1

An electromagnetic wave shielding filter 1 of Comparative Example 1 was obtained in almost the same manner as in Example 1, except that the laminate of the second anticorrosive layer/the metal layer/the first blackening layer/ the anticorrosive layer was laminated to the transparent substrate 11 with not the first anticorrosive layer but the second anticorrosive layer facing to the transparent substrate 11, and that the blackening layer was formed only on the faces of the line parts, not on the back surfaces and the side faces of the line parts.

Evaluation

Evaluation was carried out in terms of image visibility and electromagnetic wave shielding ability.

Each electromagnetic wave shielding filter was mounted on the front of a PDP "WOOO" (trademark, manufactured by Hitachi Ltd., Japan) with the transparent substrate of the electromagnetic wave shielding filter facing to the PDR A test pattern, a white solid image, and a black solid image were displayed on the PDP one after another and were visually observed from a point 50 cm apart from the screen at viewing angles of 0 to 80 degrees to evaluate the visibility of the images. In this evaluation, luminance, contrast, reflection of extraneous light at the time of black indication, and non-uniformity in blackening treatment at the time of white indication were observed. The electromagnetic wave shielding filters of Examples 1 to 4 were excellent in image visibility, but the electromagnetic wave shielding filter of Comparative Example 1 was inferior in image visibility to that of Examples 1-4. Especially when obliquely observed, the side faces of the line parts of the mesh part of the electromagnetic wave shielding filter of Comparative Example 1 were glittering, and the contrast of the images and the invisibility of the mesh part were found low.

Further, electromagnetic wave shielding ability was evaluated by the KEC method (a method of measuring electromagnetic waves developed by Kansai Electronic Industry Development Center, Japan). All of the electromagnetic wave shielding filters of Examples 1 to 4 and Comparative Example 1 attenuated, at a rate of 30 to 60 dB, electromagnetic waves having frequencies of 30 MHz to 1000 MHz and were thus found to have satisfactorily high electromagnetic wave shielding ability.

The invention claimed is:

1. An electromagnetic wave shielding filter comprising:
   a transparent substrate,
   a metal mesh layer with line parts that define openings of the mesh, laminated to one surface of the transparent substrate by an adhesive layer,
   a first blackening layer and an anticorrosive layer successively formed on transparent substrate side surfaces of the line parts of the metal mesh layer, and a second blackening layer formed on the front surfaces, on the side opposite to the transparent substrate, of the line parts of the metal mesh layer and on the side faces of the line parts.

2. The electromagnetic wave shielding filter according to claim 1, wherein the second blackening layer contains a nickel alloy.

3. The electromagnetic wave shielding filter according to claim 1, wherein the first blackening layer contains a nickel-chromium alloy.

4. The electromagnetic wave shielding filter according to claim 1, wherein the first blackening layer contains a copper-cobalt alloy, and the second blackening layer contains a nickel alloy.

5. The electromagnetic wave shielding filter according to claim 1, wherein the anticorrosive layer contains a chromium compound.

6. The electromagnetic wave shielding filter according to claim 1, wherein the anticorrosive layer contains chromium and/or zinc.

7. The electromagnetic wave shielding filter according to claim 1, wherein the anticorrosive layer contains a metal other than chromium.

8. A process for producing an electromagnetic wave shielding filter comprising a transparent substrate and a metal mesh layer with line parts that define openings of the mesh, laminated to one surface of the transparent substrate by an adhesive layer, comprising the steps of:

preparing a transparent substrate and a metal layer, successively forming a first blackening layer and an anticorrosive layer on one surface of the metal layer, laminating the metal layer, the first blackening layer and the anticorrosive layer to the transparent substrate by an adhesive layer with the anticorrosive layer facing to the transparent substrate, photolithographically making, into a mesh, the anticorrosive layer, the first blackening layer and the metal layer that have been laminated to the transparent substrate, thereby forming, in the metal layer, line parts that define openings of the mesh, and forming a second blackening layer on surfaces, on the side opposite to the transparent substrate, of the line parts of the metal layer and on side faces of the line parts.

9. The process for producing an electromagnetic wave shielding filter according to claim 8, wherein the step of forming the first blackening layer comprises deposition of a copper-cobalt alloy by electroplating, and the step of forming the second blackening layer comprises deposition of a nickel alloy by electroplating.

10. The process for producing an electromagnetic wave shielding filter according to claim 8, wherein the step of forming the anticorrosive layer comprises chromate treatment.

11. The process for producing an electromagnetic wave shielding filter according to claim 8, wherein the transparent substrate comprises a polyethylene terephthalate film, and the step of laminating the anticorrosive layer and the transparent substrate comprises dry lamination.

* * * * *